United States Patent
Lee et al.

(10) Patent No.: US 7,588,953 B2
(45) Date of Patent: Sep. 15, 2009

(54) METHOD OF FABRICATING POROUS ALUMINUM OXIDE MOLD HAVING SUB-MICRON STRUCTURE AND METHODS OF IMPRINTING TO MAKE LEDS USING THE MOLD

(75) Inventors: Yeeu-Chang Lee, Jung-li (TW); Shen-Hang Tu, Jung-li (TW); Jyh-Chen Chen, Jung-li (TW); Jenq Yang Chang, Jung-li (TW)

(73) Assignee: National Central University, Taoyuan (TW)

( * ) Notice: Subject to any disclaimer, the term of this patent is extended or adjusted under 35 U.S.C. 154(b) by 341 days.

(21) Appl. No.: 11/716,033

(22) Filed: Mar. 9, 2007

(65) Prior Publication Data

US 2008/0143015 A1    Jun. 19, 2008

(30) Foreign Application Priority Data

Dec. 14, 2006  (TW)  .............................. 95146791 A

(51) Int. Cl.
*H01L 21/02* (2006.01)
*B21D 33/00* (2006.01)

(52) U.S. Cl. ...................... 438/29; 438/32; 257/E21.04; 29/17.2

(58) Field of Classification Search .................. 438/29, 438/32; 257/E21.04; 29/17.2
See application file for complete search history.

(56) References Cited

U.S. PATENT DOCUMENTS

| | | | | |
|---|---|---|---|---|
| 3,574,681 A | * | 4/1971 | Cecil | 29/592.1 |
| 3,850,762 A | * | 11/1974 | Smith | 205/75 |
| 2005/0117194 A1 | * | 6/2005 | Kim et al. | 359/273 |
| 2006/0289351 A1 | * | 12/2006 | Xiao et al. | 210/500.25 |
| 2007/0151850 A1 | * | 7/2007 | Wang et al. | 204/424 |

OTHER PUBLICATIONS

Summary Page for Lu Y.C. et al., "Formation of a new aluminum oxide with the composition AlO2 by interfacial reaction between Pt and Al2o3", 1994, (to be found in Acta metallurgica et materialia ISSN 0956-7151, vol. 42, No. 4, pp. 1125-1137), One page.*

* cited by examiner

*Primary Examiner*—Evan Pert
(74) *Attorney, Agent, or Firm*—Troxell Law Office PLLC

(57) ABSTRACT

An mold having a sub-micron, or even nano, structure is fabricated. The mold is a porous aluminum oxide mold. With the mold, a sub-micron pattern is easily imprinted on a large surface of a substrate or a LED. No expensive equipment is necessary. The fabricating process is fast and cheap and thus meets the needs of producers.

14 Claims, 29 Drawing Sheets

METHOD OF FABRICATING POROUS ALUMINUM OXIDE MOLD HAVING SUB-MICRON STRUCTURE AND METHODS OF IMPRINTING TO MAKE LEDS USING THE MOLD

FIELD OF THE INVENTION

The present invention relates to fabricating a mold; more particularly, relates to obtaining a porous mold, aluminum oxide ($Al_2O_3$) for mass-imprinting a sub-micron structure on a light emitting diode (LED), a laser diode or a substrate with a fast speed and a cheap cost.

DESCRIPTION OF THE RELATED ARTS

A nano pattern imprinted on a semiconductor is mainly performed through electron beam lithography. This technology has a disadvantage of slow speed that does not meet a user's requirements. There is still another method for imprinting nano patterns, called laser interferometry lithography. Its disadvantage is that it is hard to imprint a pattern evenly on a large surface. Besides, producers usually use masks on imprinting nano pattern and thus the cost is high. Hence, the prior arts do not fulfill users' needs.

SUMMARY OF THE INVENTION

The main purpose of the present invention is to fabricate a porous aluminum oxide ($Al_2O_3$) mold with pore size, pore space in between, and film thickness all controlled through process parameters.

Another purpose of the present invention is to quickly and cheaply mass-imprint a sub-micron structure on a large surface of a LED, a laser diode or a substrate to meet the needs of producers.

To achieve the above purpose, the present invention is a method of fabricating a porous $Al_2O_3$ mold having a sub-micron structure, comprising steps of (a1) obtaining an aluminum pre-mold structure from an aluminum foil through annealing; (a2) cleansing the aluminum pre-mold structure and electrolytic polishing a surface of the aluminum pre-mold structure by an electrochemical method; (a3) anodizing the aluminum pre-mold structure and cleansing the aluminum pre-mold structure with a deionized water; (a4) fast-drying the aluminum pre-mold structure with ethanol and forming an oxidized layer; and, (a5) after being cleansed with a deionized water partially removing the oxidized layer by using a phosphoric acid to obtain a porous $Al_2O_3$ mold having a sub-micron structure after drying the aluminum pre-mold structure in the air, where the porous $Al_2O_3$ mold is used to imprint a sub-micron structure on a LED, a substrate, etc. and to further fabricate a p-side up LED or an n-side up LED. Accordingly, a novel method of fabricating a porous $Al_2O_3$ mold having a sub-micron structure is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the sectional view showing the porous $Al_2O_3$ mold according to the preferred embodiment of the present invention;

FIG. 5A to FIG. 5D a reviews showing fabricating the p-side up LED; and

FIG. 6A to FIG. 6E are views showing fabricating the n-side up LED;

DESCRIPTION OF THE PREFERRED EMBODIMENT

The following description of the preferred embodiment is provided to understand the features and the structures of the present invention.

Figure 1:
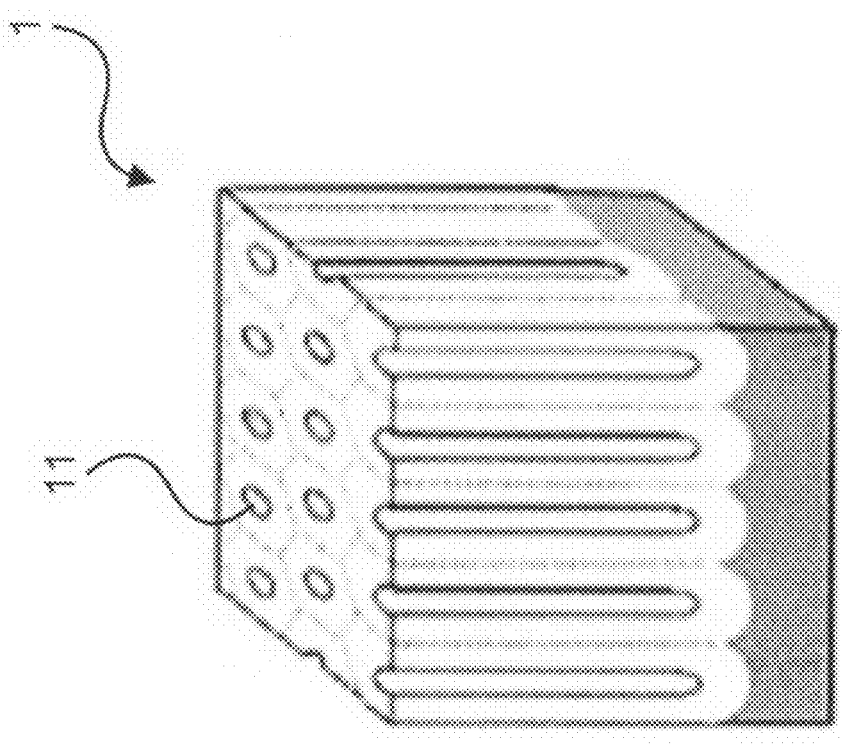
Figure 2A:
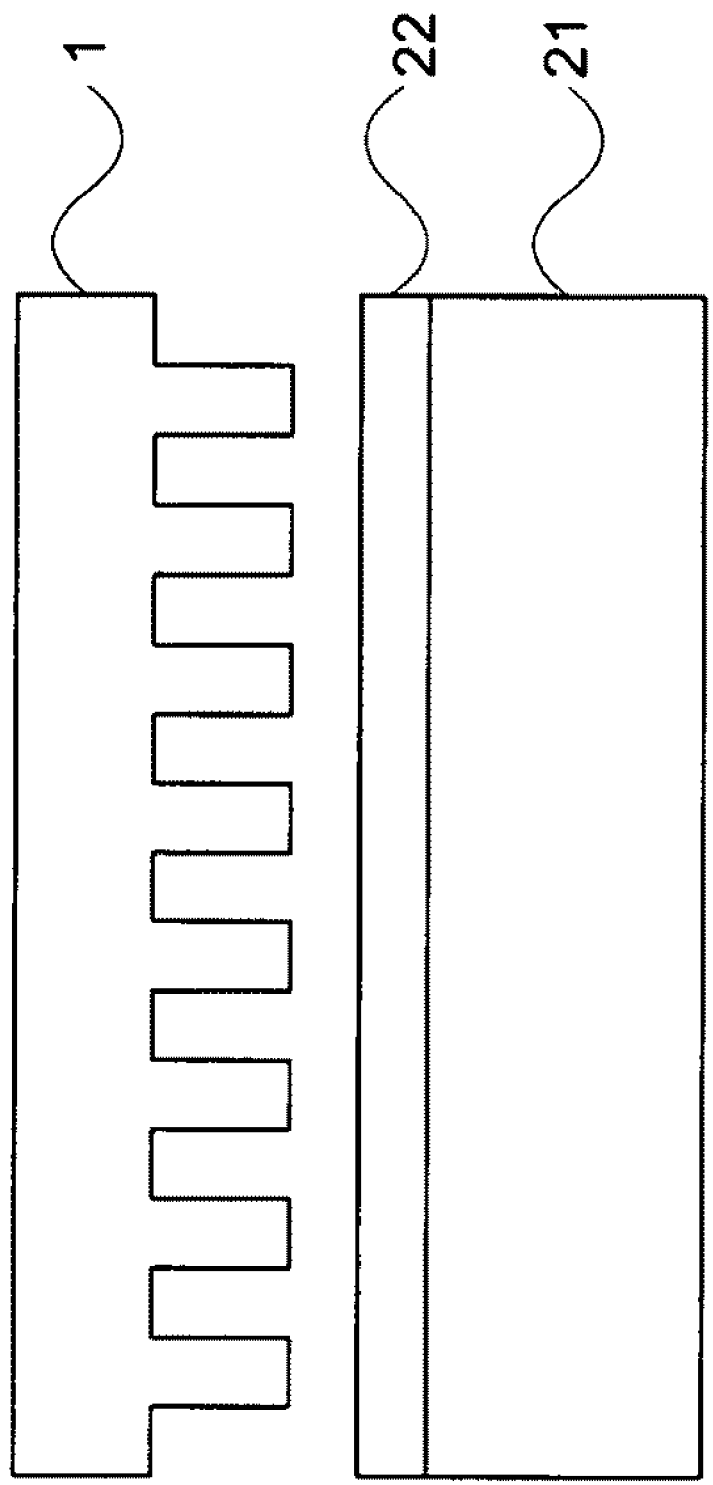
FIG. 2A to FIG. 2E are views showing the first imprint method.
Figure 2B:
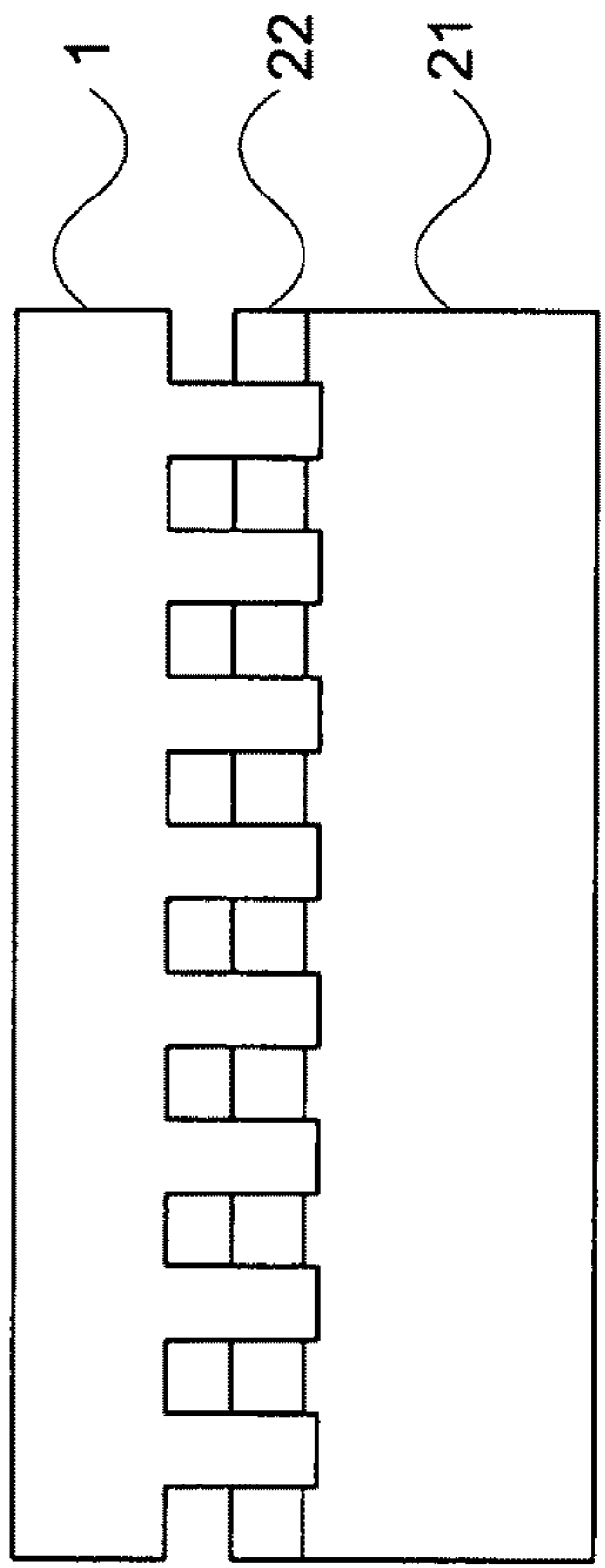
Figure 2C:
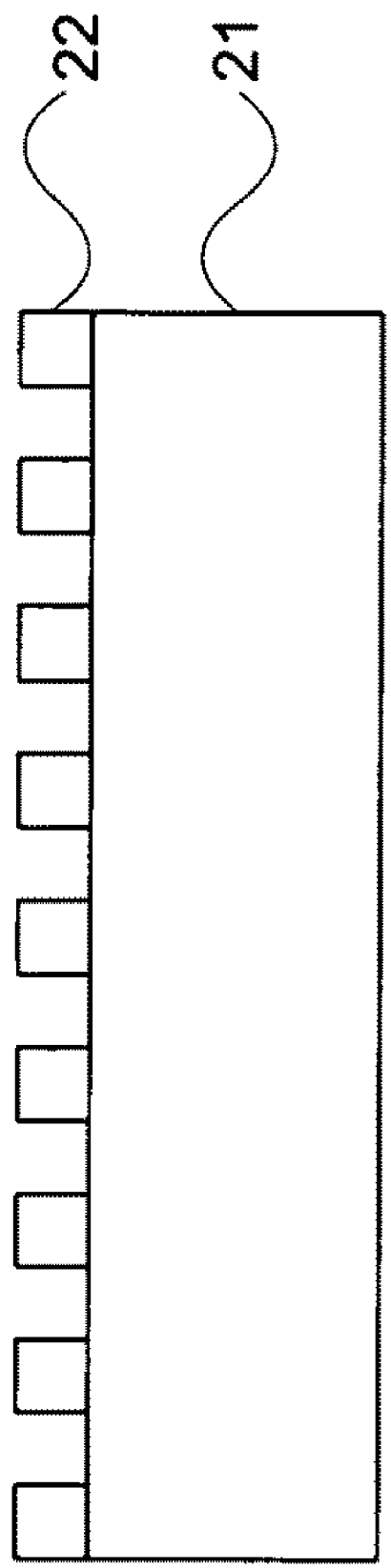
Figure 2D:
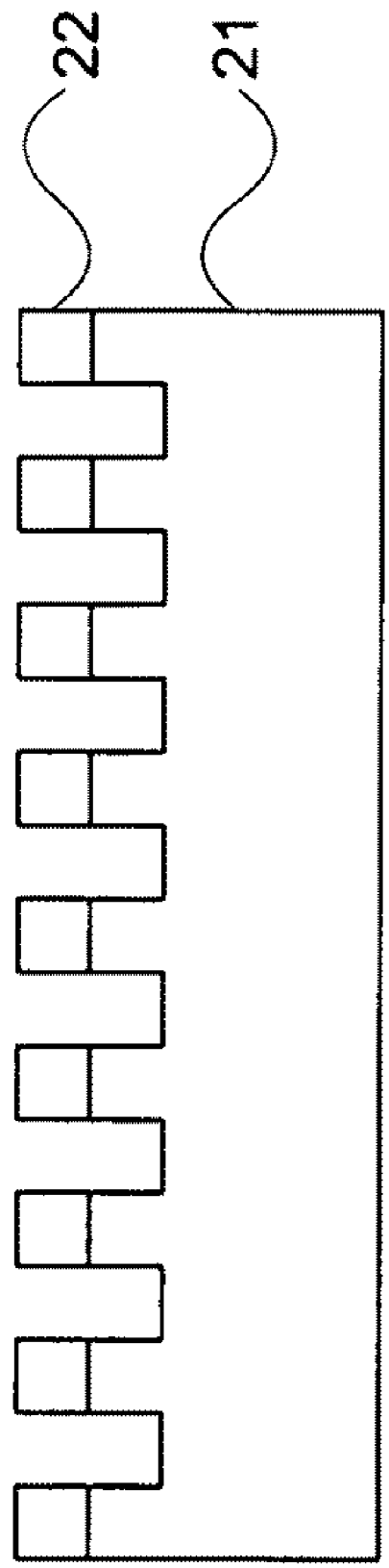
Figure 2E:
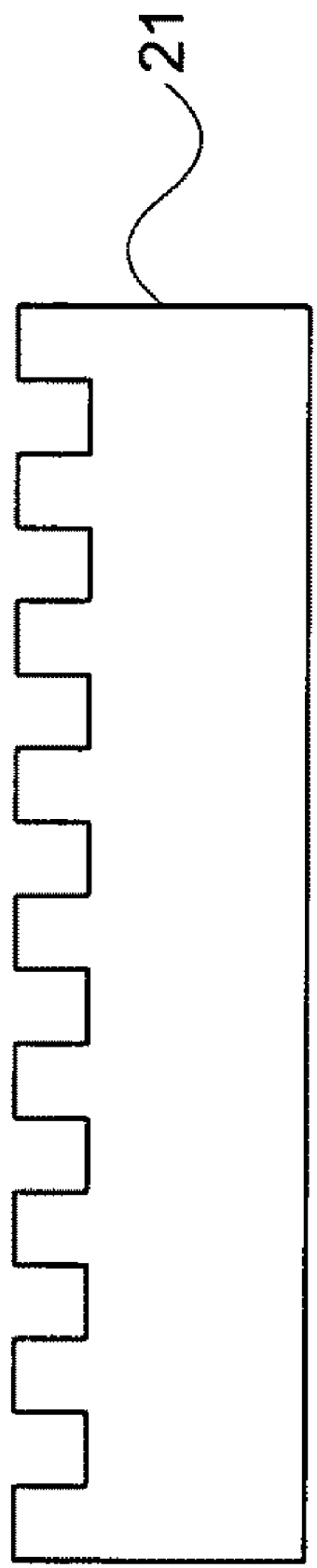
Figure 3A:
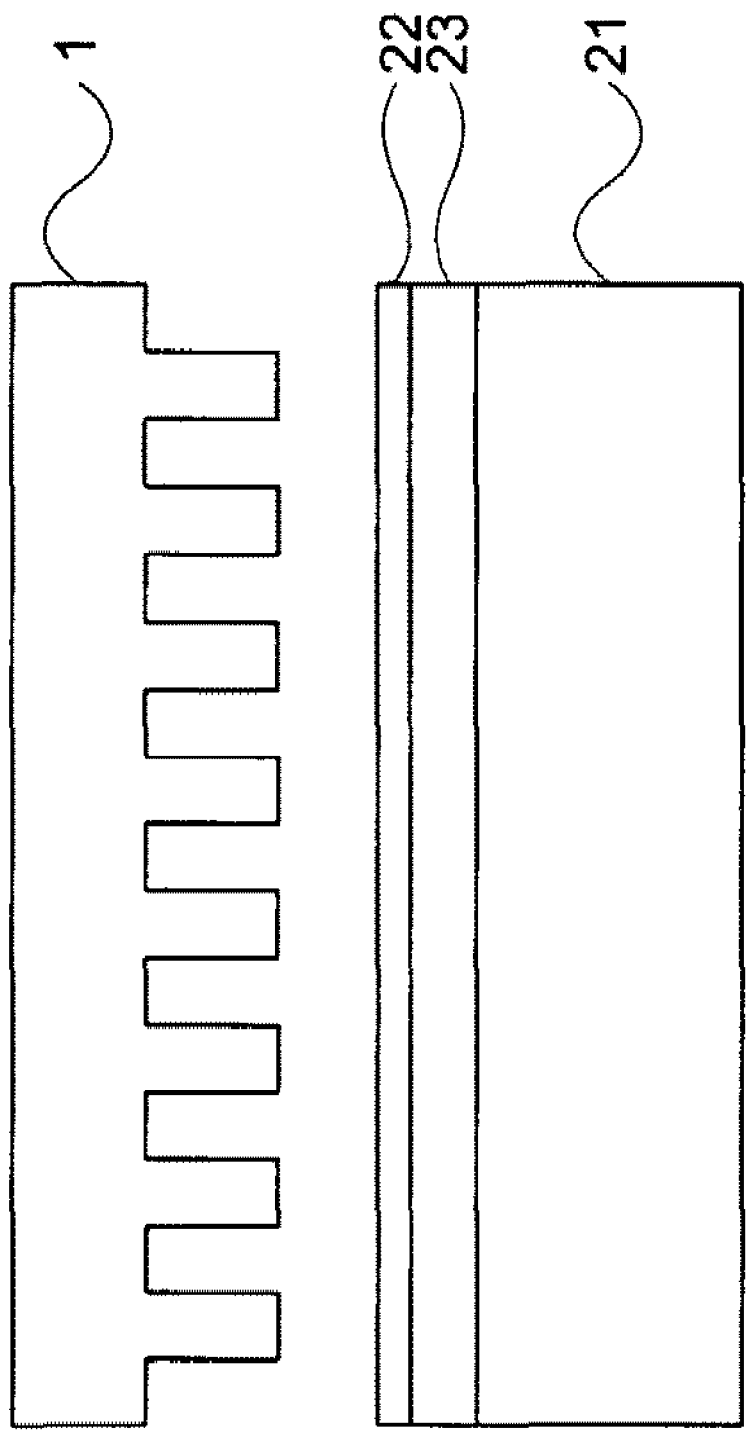
FIG. 3A to FIG. 3G are views showing the second imprint method.
Figure 3B:
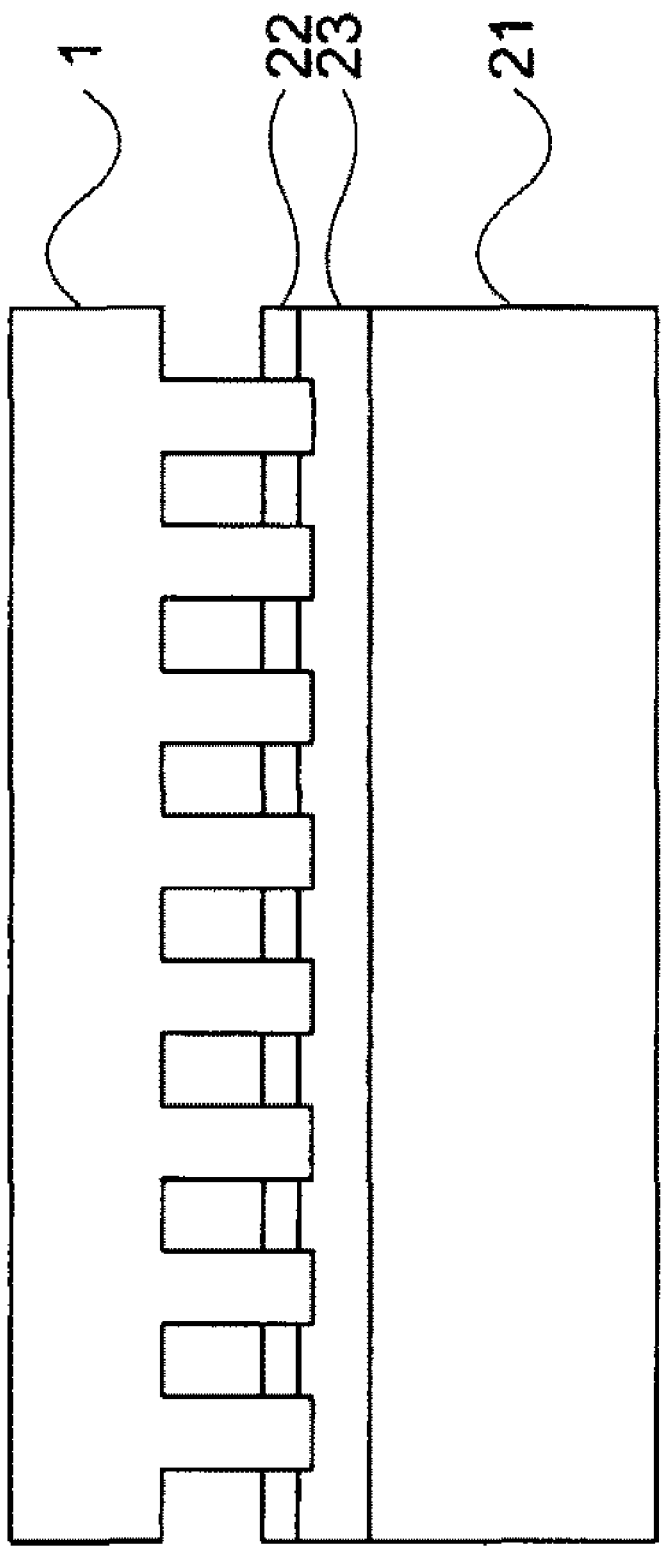
Figure 3C:
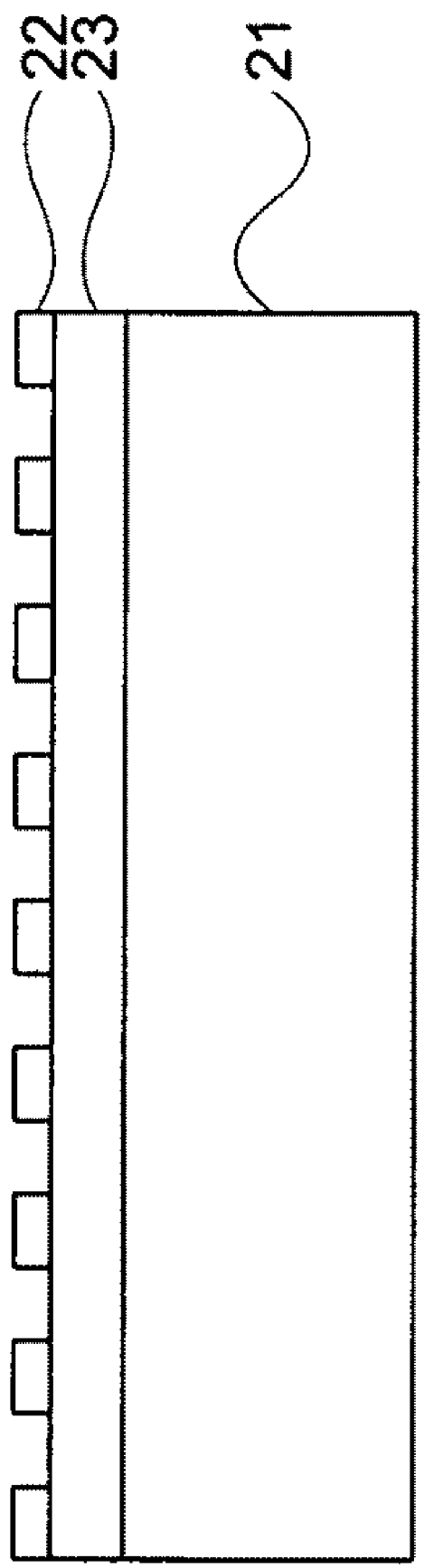
Figure 3D:
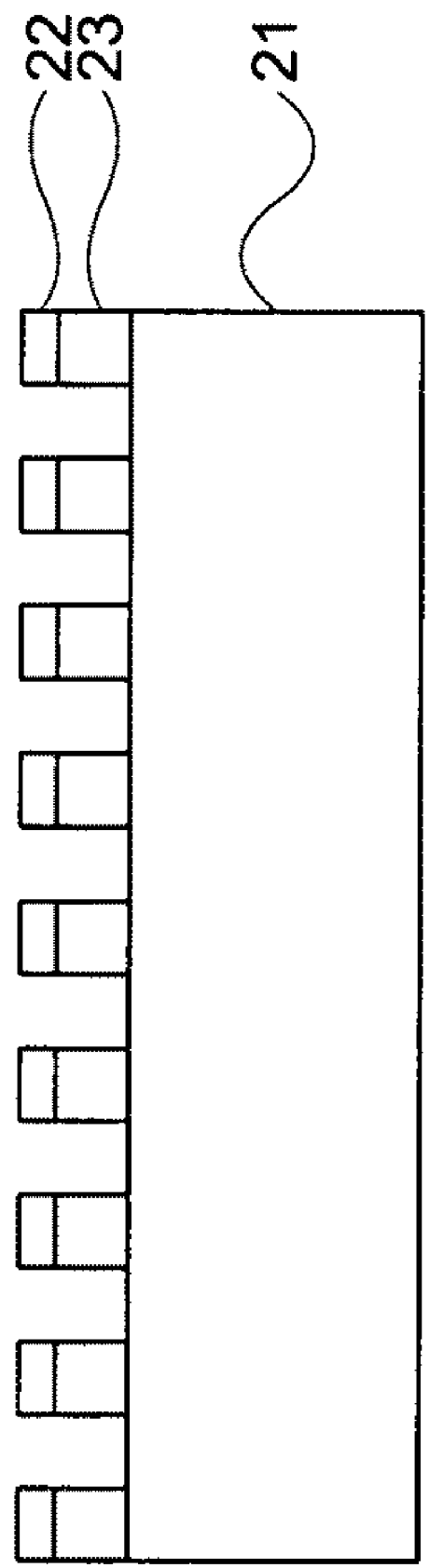
Figure 3E:
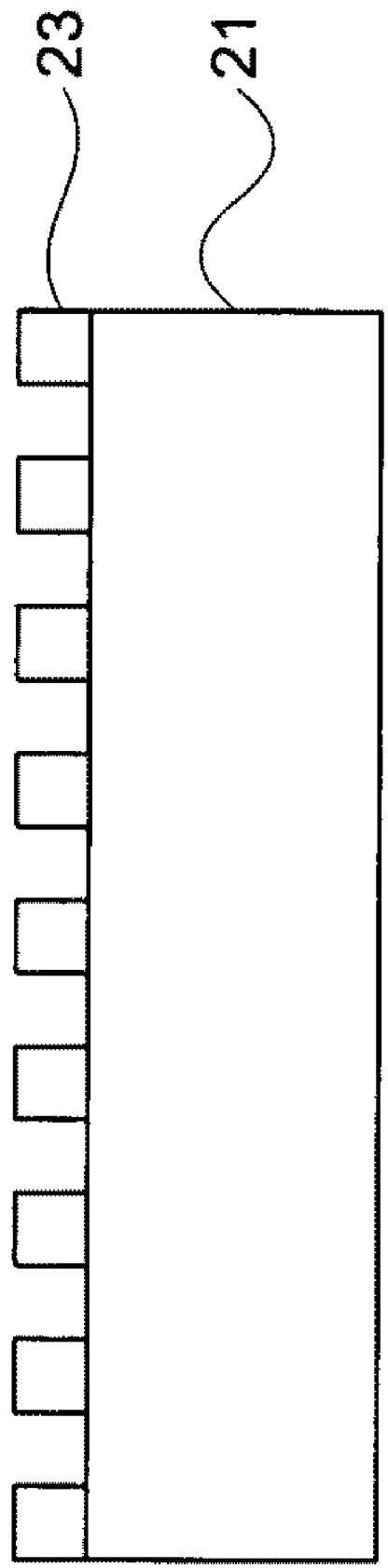
Figure 3F:
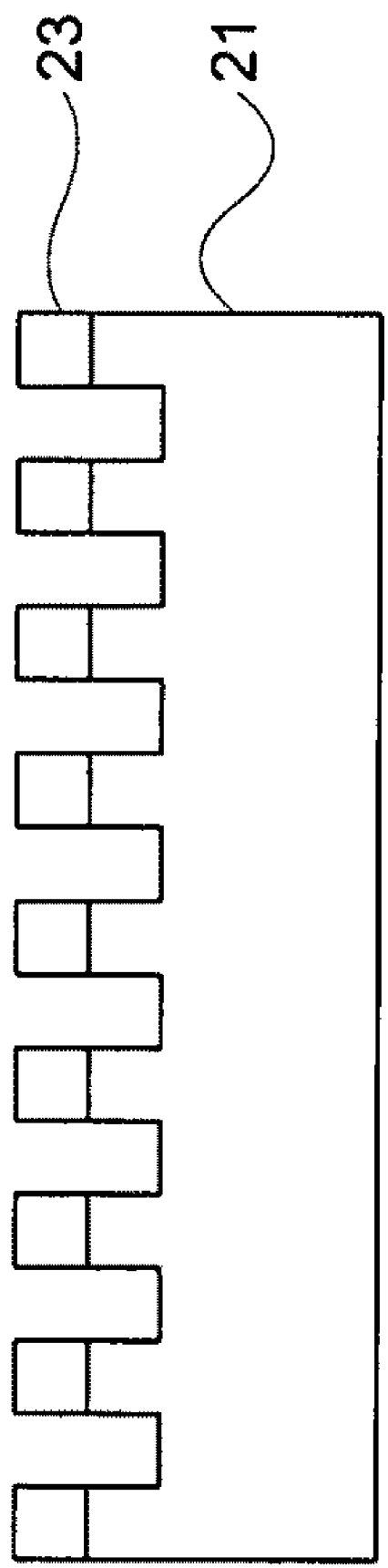
Figure 3G:
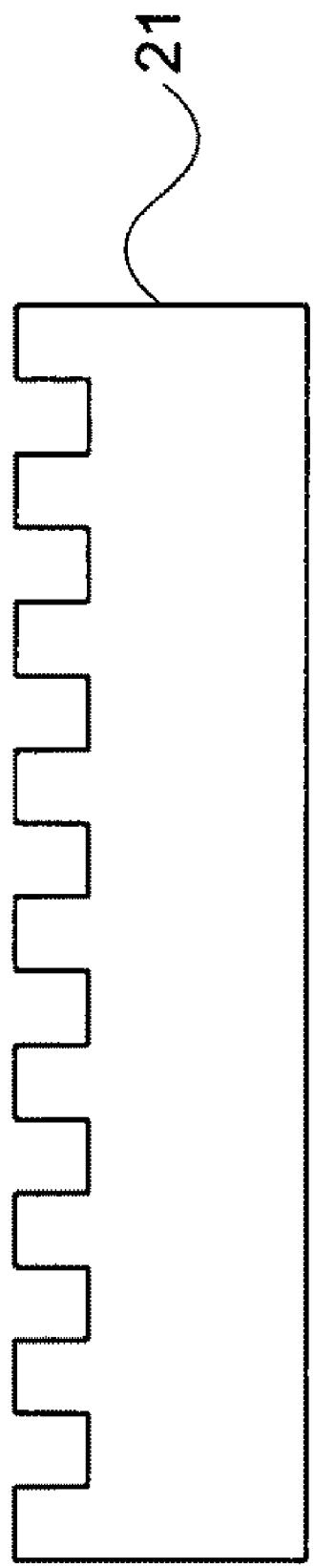
Figure 4A:
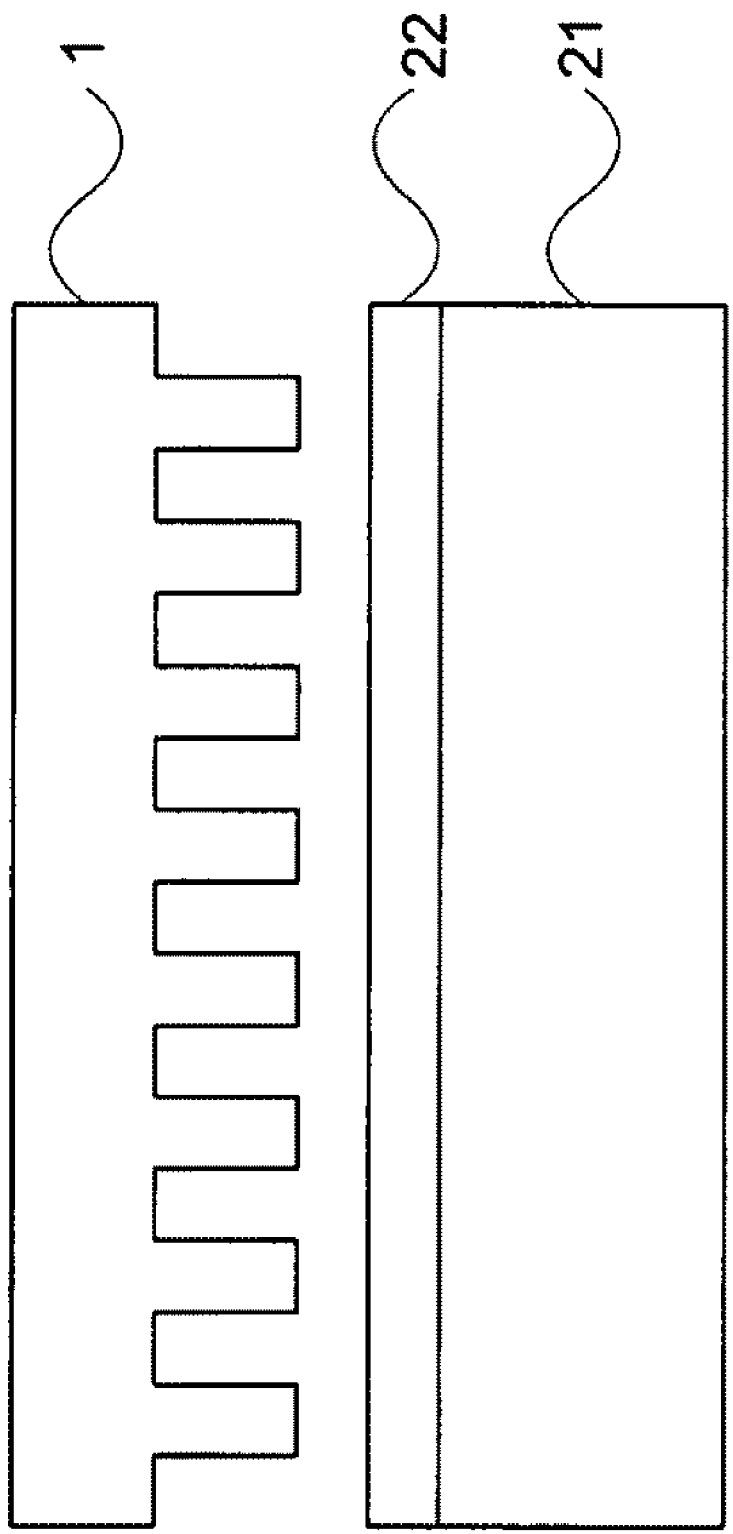
FIG. 4A to FIG. 4G are views showing the third imprint method.
Figure 4B:
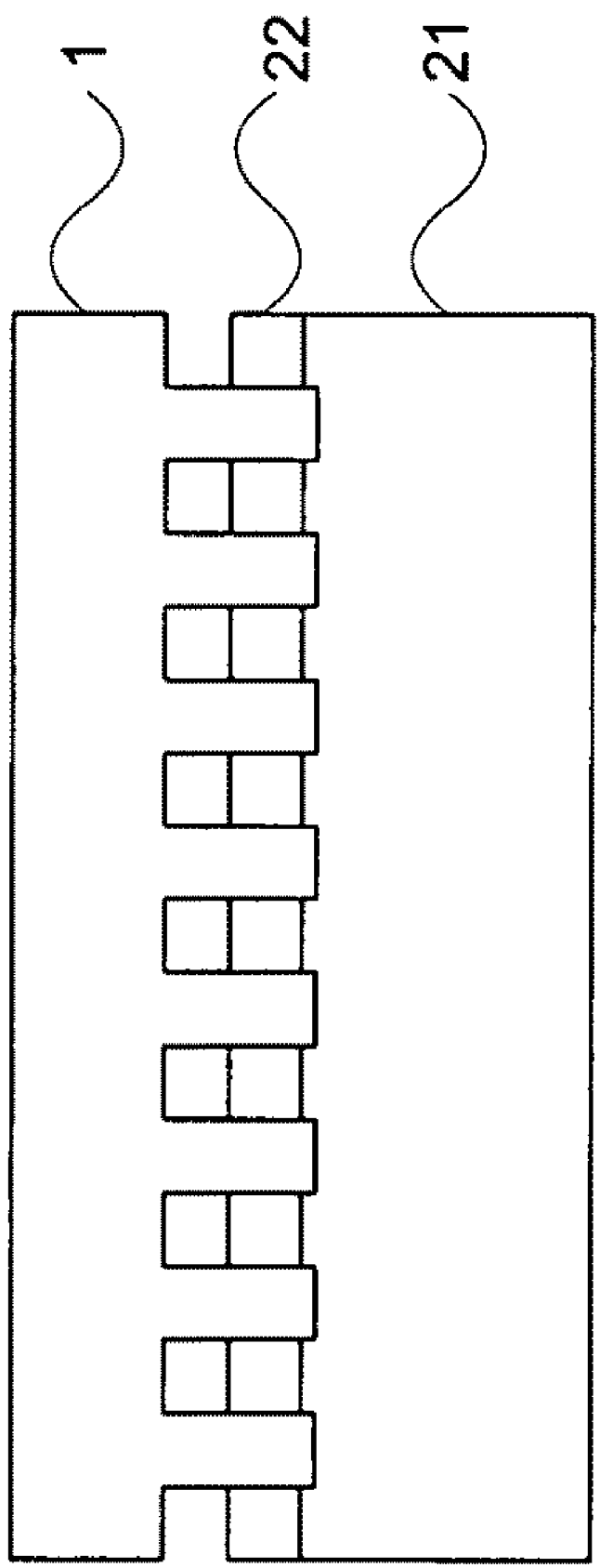
Figure 4C:
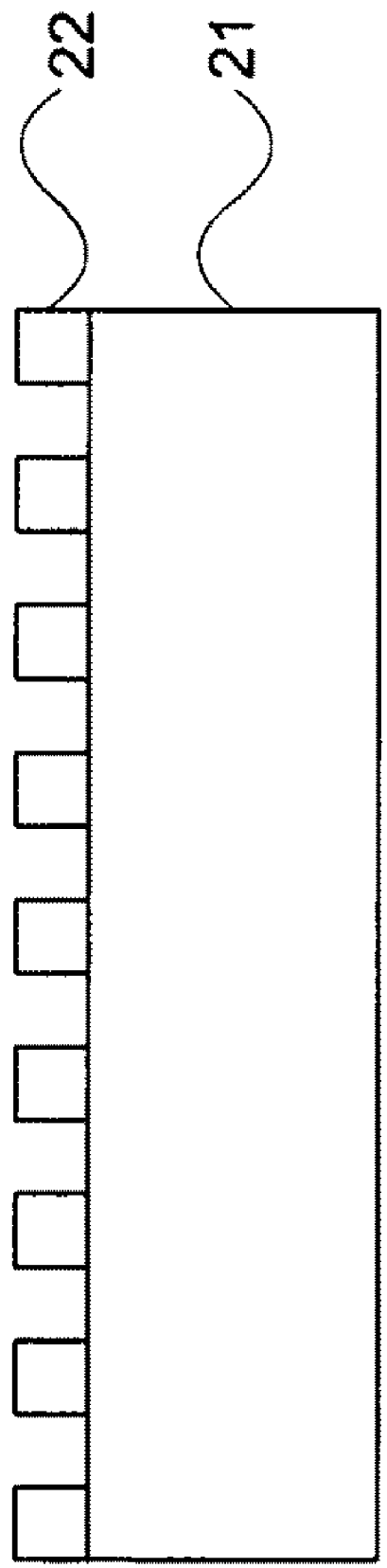
Figure 4D:
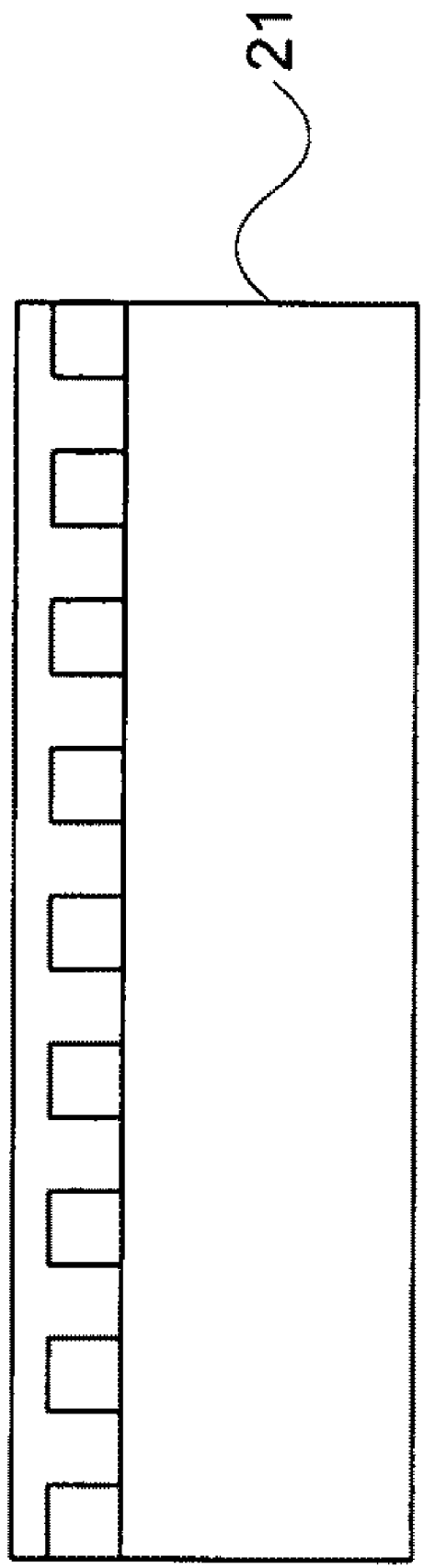
Figure 4E:
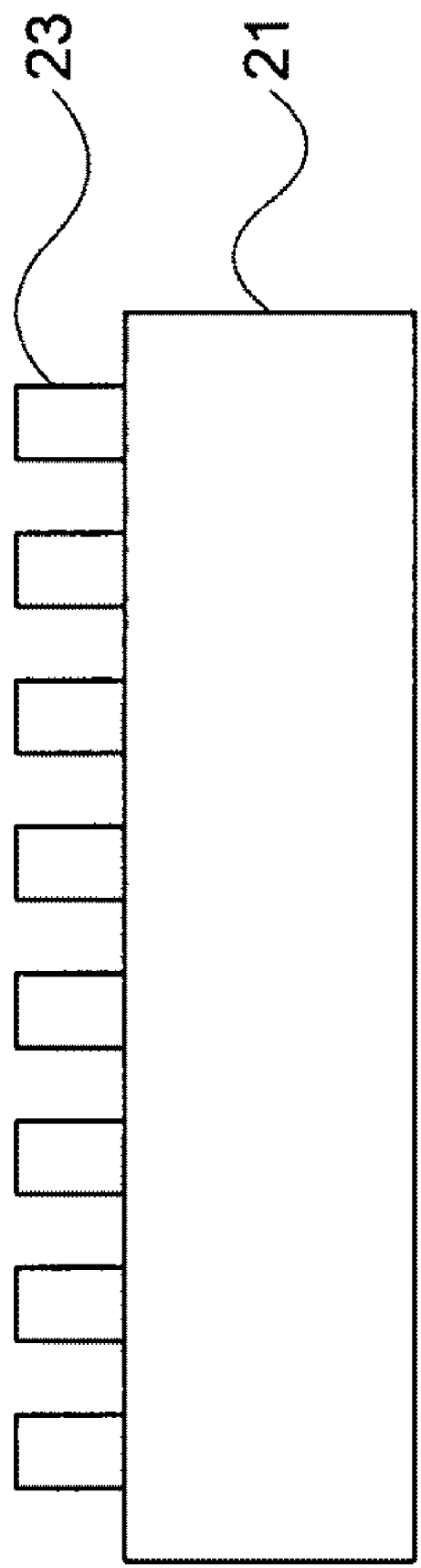
Figure 4F:
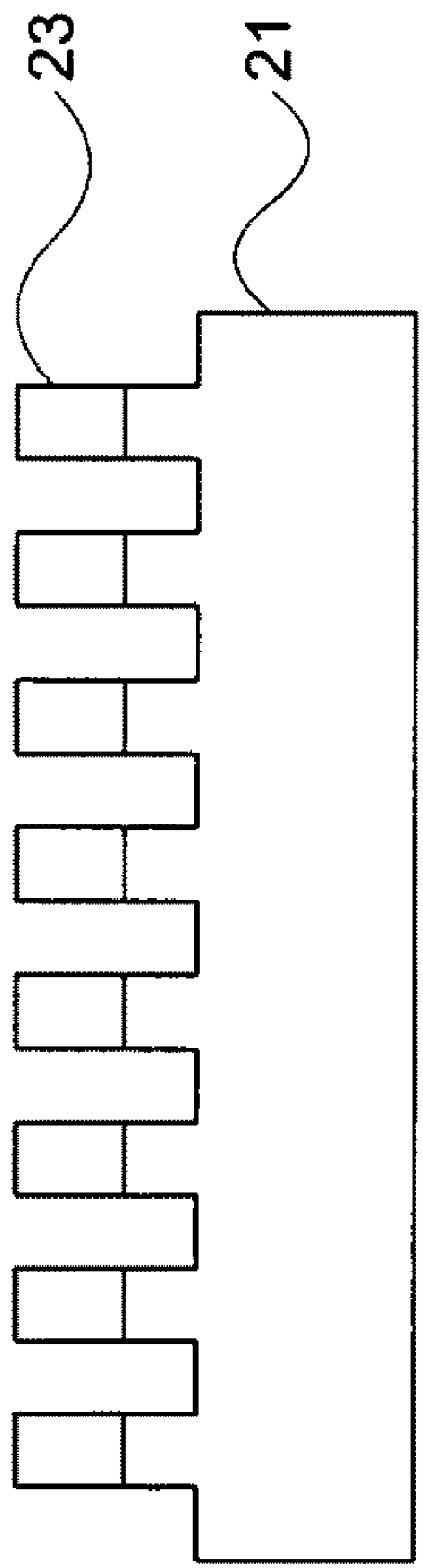
Figure 4G:
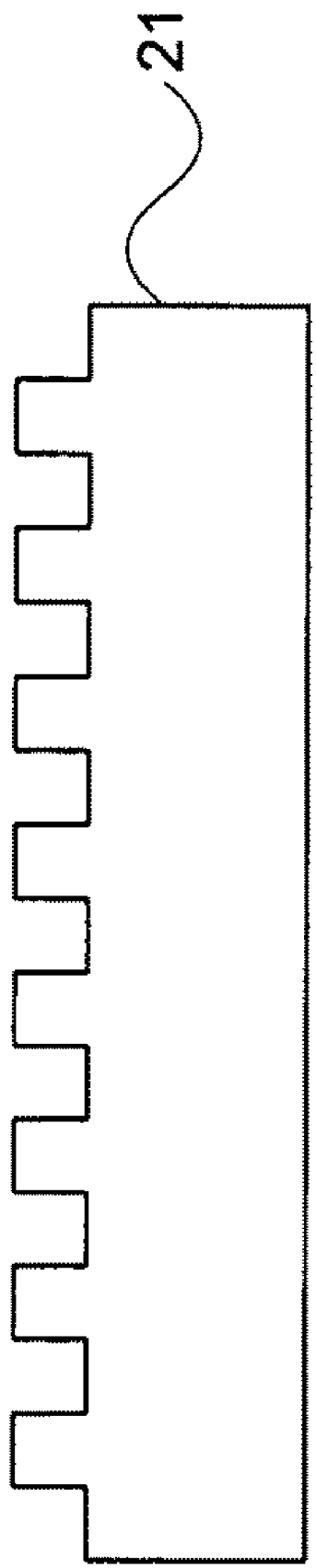
Figure 5A:
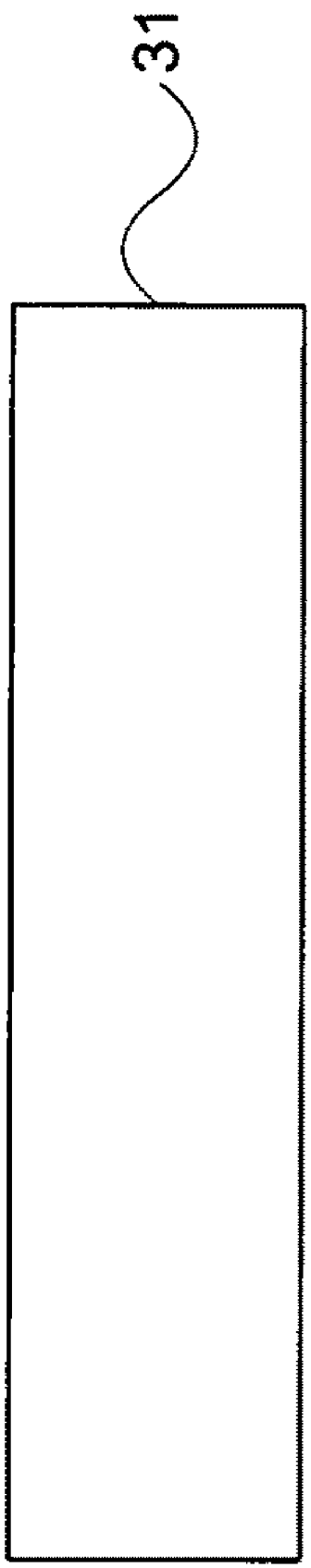
Figure 5B:
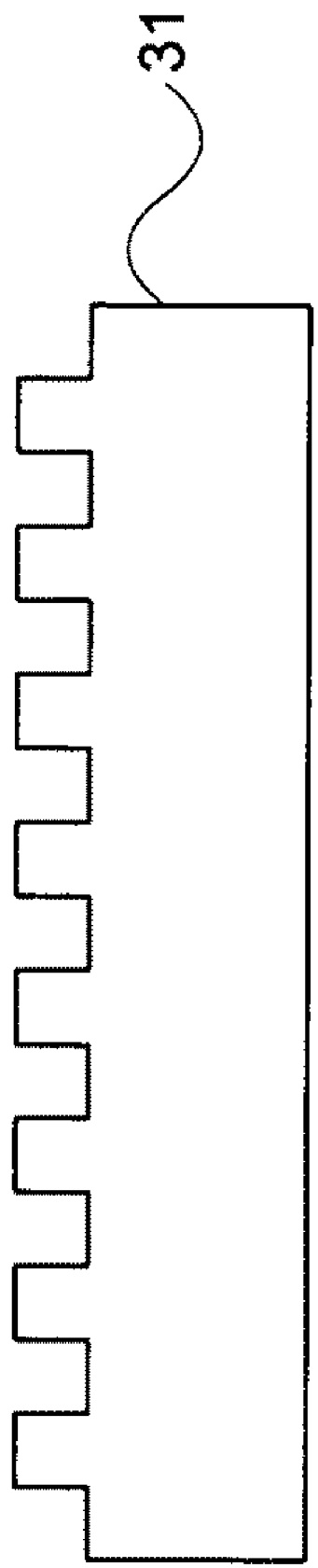
Figure 5C:
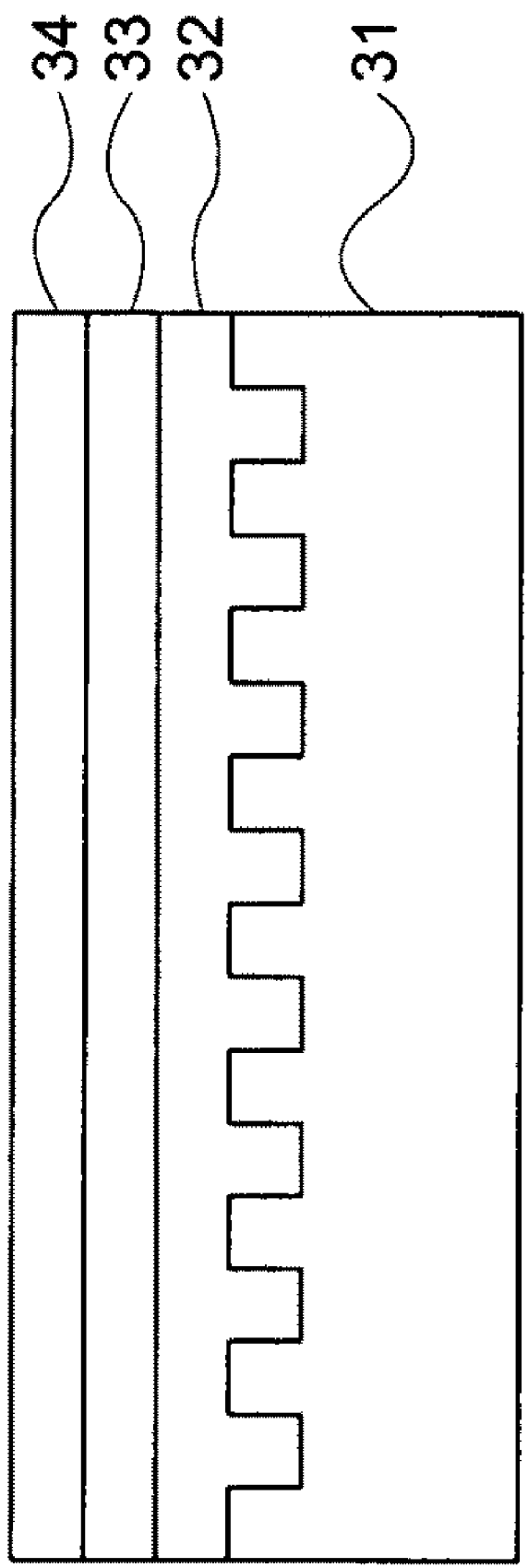
Figure 5D:
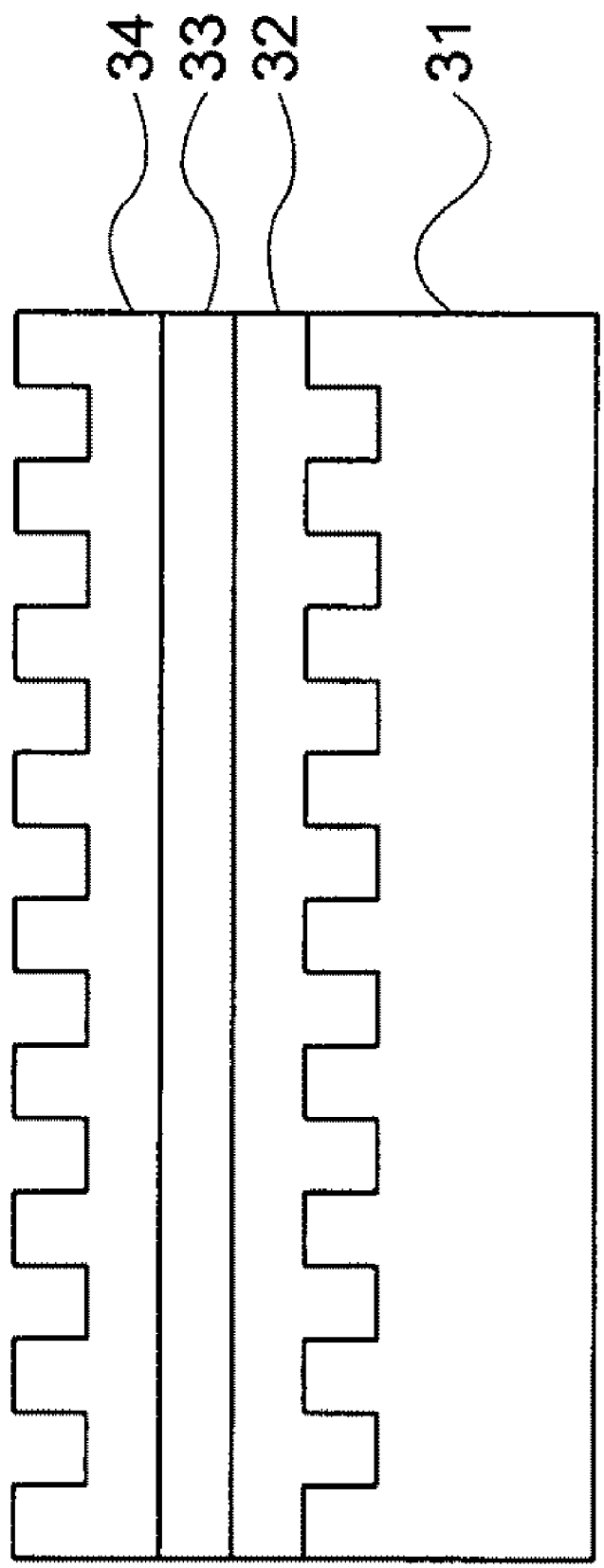
Figure 6A:
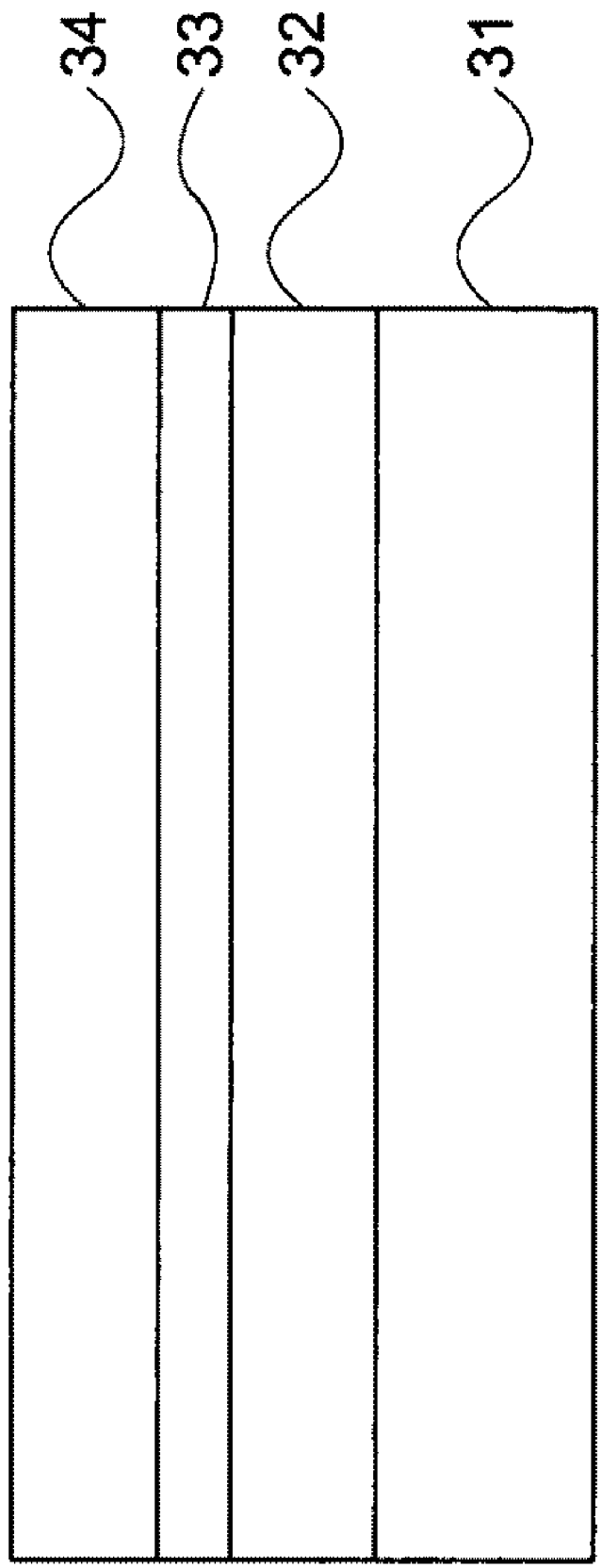
Figure 6B:
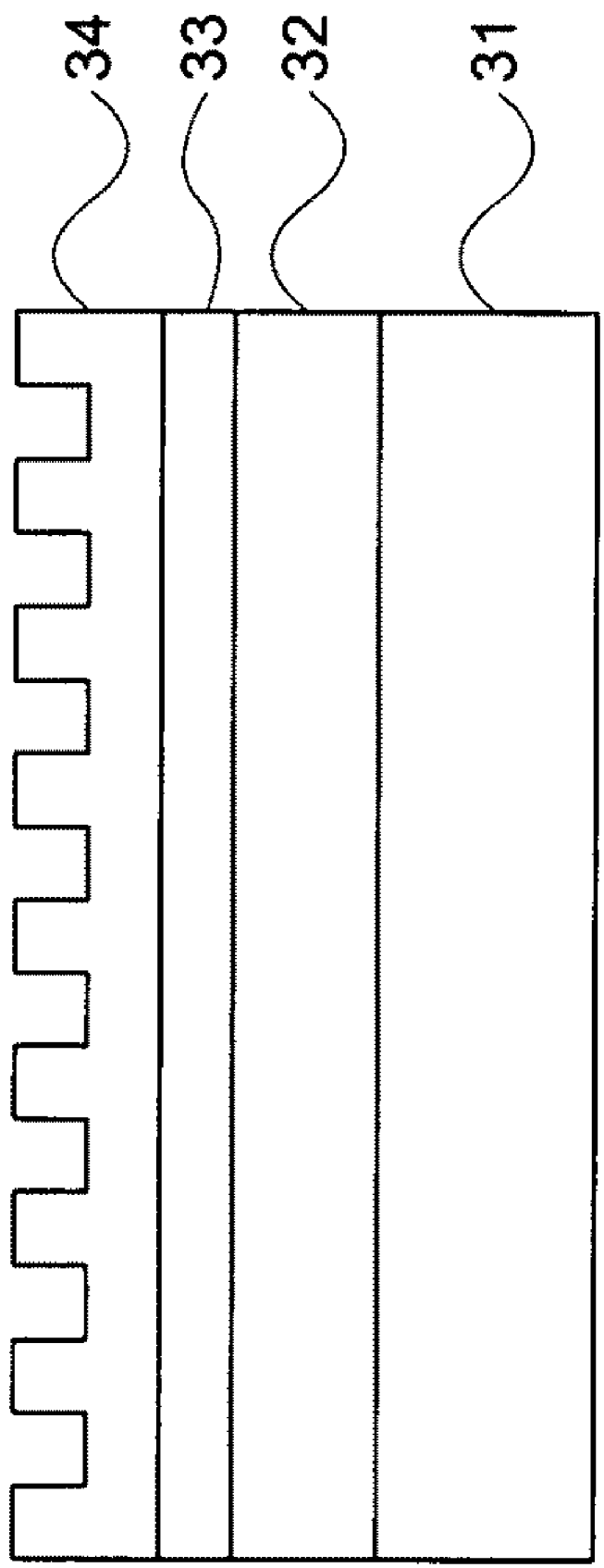
Figure 6C:
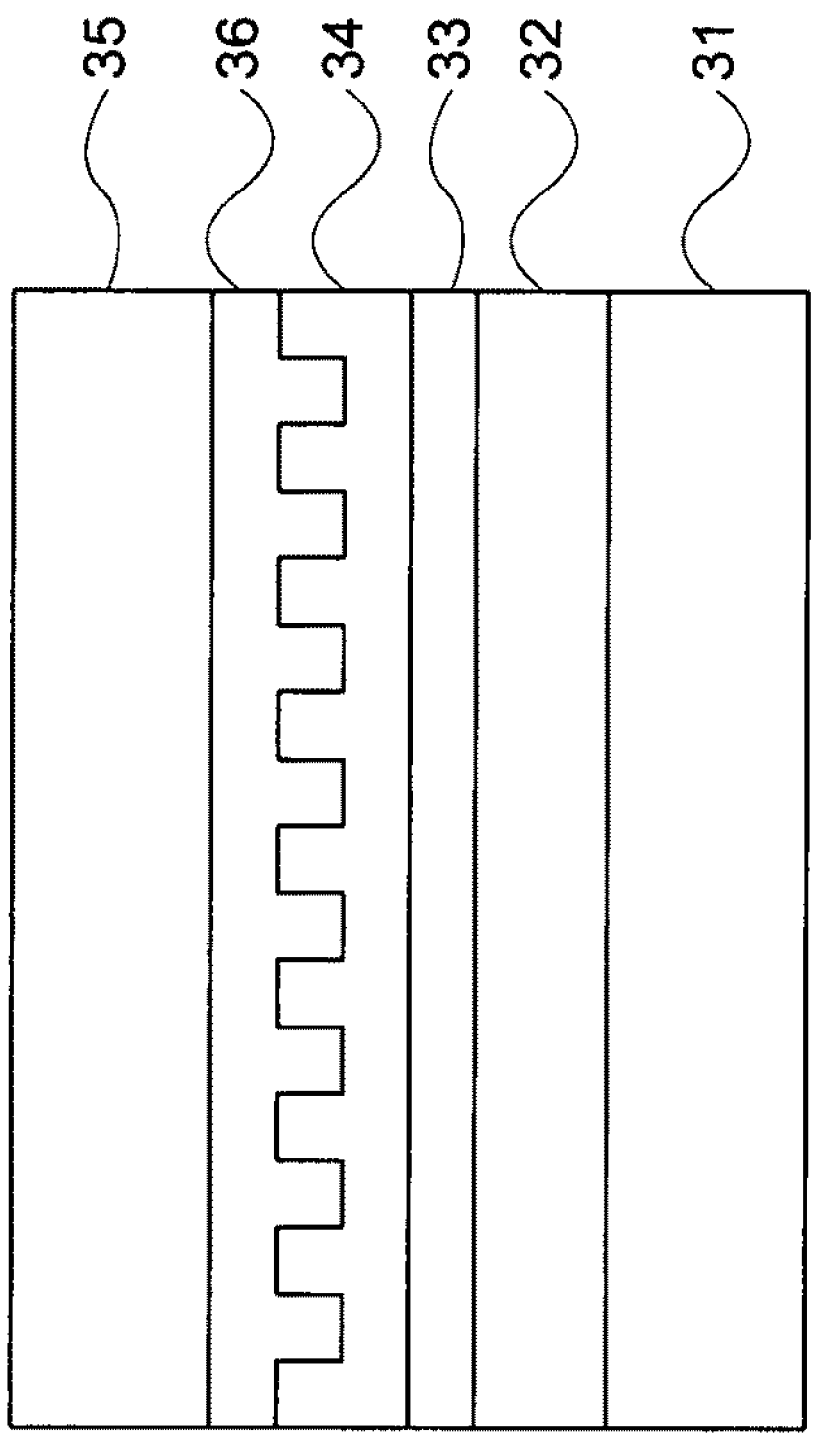
Figure 6D:
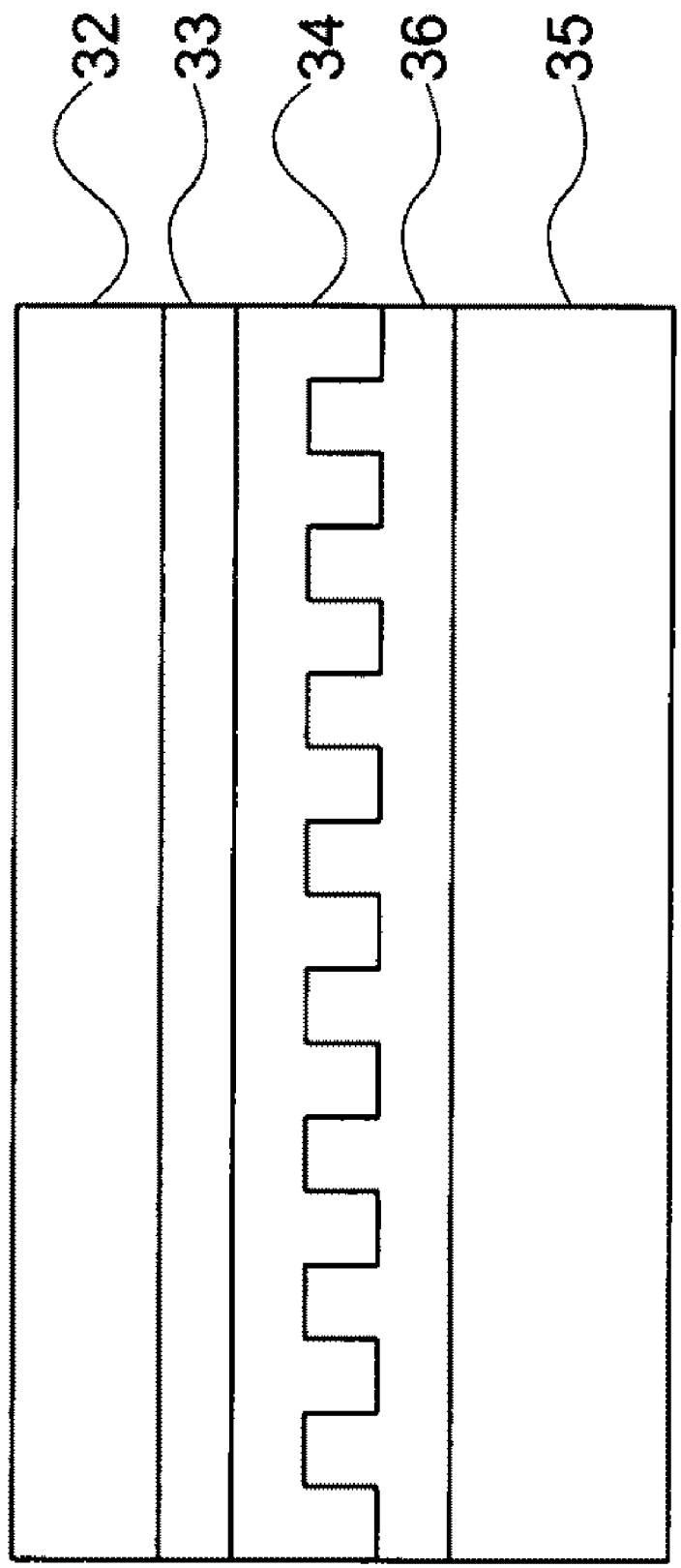
Figure 6E:
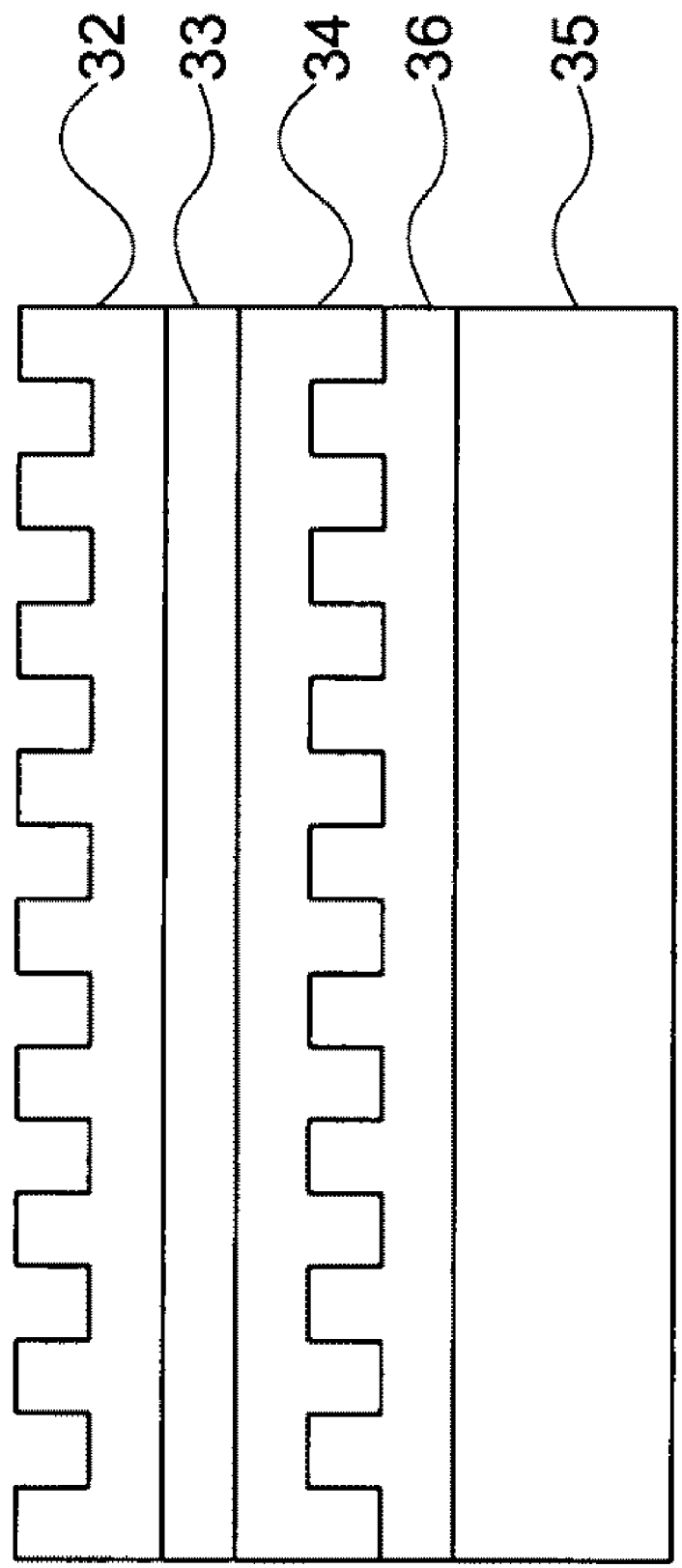

Please refer to FIG. 1 which is a sectional view showing a porous aluminum oxide ($Al_2O_3$) mold according to a preferred embodiment of the present invention. As shown in the figure, the present invention is a method of fabricating a porous aluminum oxide mold having a sub-micron structure, comprising the following steps:

(a1) An aluminum foil is obtained to be processed through an annealing to obtain an aluminum pre-mold structure. Through the annealing, pores 11 in the aluminum pre-mold structure are arranged orderly and have even diameters.

(a2) After cleansing the aluminum pre-mold structure, the aluminum pre-mold structure is electrolytic polished on a surface by an electrochemical method, where impurities on the surface are removed and a smooth surface is obtained.

(a3) An anodizing is performed on the aluminum pre-mold structure and then the aluminum pre-mold structure is cleansed with a deionized water, where the aluminum pre-mold structure can be subjected to the anodizing process twice; the anodizing process uses a power supplier whose anode is connected with the aluminum pre-mold structure and whose cathode is connected with a graphite rod; the aluminum pre-mold structure is immersed in an electrolyte of a phosphoric acid, an oxalic acid or a sulfuric acid; and the electrolyte is stirred with a magnetic stirbar.

(a4) An ethanol is used to fast dry the aluminum pre-mold structure and an ivory-white film of an oxidized layer is formed on a surface.

(a5) A phosphoric acid is used to partially remove (e.g., by partially etching) the oxidized layer and then is washed with a deionized water to be dried in air to obtain a porous $Al_2O_3$ mold 1, where the porous $Al_2O_3$ mold 1 is kept immersed in the phosphoric acid to obtain bigger pores having even diameters.

Pores obtained after anodizing are usually distributed into a difform pattern. A structure thus formed on a surface of a LED obtains a difform pattern to increase roughness which is in favor of light extraction. On the contrary, if a uniform pattern is preferred, the porous $Al_2O_3$ mold needs to be pre-processed or be anodized again. Moreover, the pore-sizes and spaces between pores of the porous $Al_2O_3$ mold are controlled by changing process parameters of the anodizing process, type of electrolyte used, voltage, time, etc.

When the porous $Al_2O_3$ mold has pores forming a uniform pattern, the light extraction efficiency is improved by forming a photonic crystal structure, which has pores with proper sizes and a proper periodicity, on a surface of the n-type semiconductor and a surface of the p-type semiconductor. Besides, a proper mask can be deposed on a surface of the aluminum mold so that, in the process of anodizing, the area below the mask does not have any pores, which differs from the other porous structure of areas without the mask covered.

Hence, the porous $Al_2O_3$ mold can have photonic crystal resonant cavities and a special porous structure obtained with a mask.

Please refer to FIG. 2A to FIG. 2E which are views showing a first imprint method. As shown in the figures, a porous $Al_2O_3$ mold according to the present invention has a first imprint method, comprising the following steps:

(b1) A polymer resist 22 is coated on a surface of an object, such as a first substrate 21.

(b2) The object is imprinted by the porous $Al_2O_3$ mold.

(b3) After cooling down the temperature, the polymer resist 22 is removed through etching, and an area on the surface of the object is thus revealed.

(b4) In the end, the object is etched on the area to obtain a sub-micron pattern Please refer to FIG. 3A to FIG. 3G, which are views showing a second imprint method. As shown in the figures, a porous $Al_2O_3$ mold according to the present invention is used in a second imprint method, comprising the following steps:

(c1) A protection layer 23 and then a polymer resist 22 are sequentially coated on a surface of an object, such as a first substrate 21.

(c2) The object is imprinted by the porous $Al_2O_3$ mold.

(c3) After lowering the temperature, the polymer resist 22 is removed through etching to reveal the protection layer 23; thus, after removing the polymer resist 22, the protection layer 23 is used as an etching barrier.

(c4) Then, the protection layer 23 is etched to reveal an area on the surface of the object.

(c5) In the end, the object is etched on the area to obtain a sub-micron pattern.

Please refer to FIG. 4A to FIG. 4G which are views showing a third imprint method. As shown in the figures, a porous $Al_2O_3$ mold according to the present invention has a third imprint method, comprising the following steps:

(d1) A polymer resist 22 is coated on a surface of an object, such as a first substrate 21.

(d2) The object is imprinted by the porous $Al_2O_3$ mold.

(d3) After lowering the temperature, a protection layer 23 is coated on the polymer resist and surface of the object.

(d4) Then through a process of lifting-off, the polymer resist 22, together with portions of the protection layer 23 above the polymer resist 22, is removed to reveal an area on the surface of the object.

(d5) In the end, the object is etched on the area to obtain a sub-micron pattern.

Please refer to FIG. 5A to FIG. 5D which are views showing fabricating a p-side up LED. As shown in the figures, at first, in step (e), a first substrate 31 is imprinted by a first, a second, or a third imprint method according to the present invention and then the first substrate 31 is sequentially grown with epitaxy layers of an n-type semiconductor 32, an active layer 33 and a p-type semiconductor 34. And then, in step (f), the p-type semiconductor 34 is imprinted by the first, the second or the third imprint method to obtain a sub-micron pattern. Hence, a p-side up LED is obtained.

Please refer to FIG. 6A to FIG. 6E, which are views showing fabricating an n-side up LED. As shown in the figures, at first, in step (g), a first substrate 31 is sequentially grown with epitaxy layers of an n-type semiconductor 32, an active layer 33 and a p-type semiconductor 34 and then the p-type semiconductor 34 is imprinted by a first, a second or a third imprint method according to the present invention. Then, in step (h), a second substrate 35 is bonded on the p-type semiconductor 34 to obtain a bonded layer 36. Then, in step (i), the first substrate 31 is removed to reveal the n-type semiconductor 32. And then, in step (j), the n-type semiconductor 32 is imprinted by the first, the second or the third imprint method to obtain a sub-micron pattern. Hence, an n-side up LED is obtained.

Consequently, as is described above, a first, a second or a third imprint method according to the present invention is used at various layers of a LED and different patterns are obtained on the p-type semiconductor, the p-type semiconductor and the substrate.

In summary, the present invention is a method of fabricating a porous $Al_2O_3$ mold having a sub-micron structure, where a porous $Al_2O_3$ mold is fabricated with pore size, pore space in between, and film thickness all controlled through process parameters; the porous $Al_2O_3$ mold fabricated has good mechanical and chemical characteristics; the fabrication requires no expensive equipment and is easy; and, a sub-micron structure is quickly and cheaply mass-imprinted on a large surface of a LED, a laser diode or a substrate, which meets the needs of producers.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating a porous aluminum oxide ($Al_2O_3$) mold having a sub-micron structure, comprising steps of:
    (a1) obtaining an aluminum pre-mold structure through annealing aluminum foil;
    (a2) cleansing said aluminum pre-mold structure and polishing a surface of said aluminum structure by electrolytic polishing;
    (a3) anodizing said aluminum mold and cleansing said aluminum pre-mold structure by using a deionized water;
    (a4) fast-drying said aluminum pre-mold structure by using ethanol and forming an oxidized layer; and
    (a5) partially etching said oxidized layer by using a phosphoric acid after said aluminum pre-mold structure being cleansed by using a deionized water, and thus obtaining a porous aluminum oxide mold having a sub-micron structure after drying said aluminum pre-mold structure in the air.

2. The method according to claim 1, wherein said anodizing has an electrolyte selected from a group consisting of a phosphoric acid, an oxalic acid and a sulfuric acid.

3. The method according to claim 1, wherein said anodizing has a power supplier having an anode connected with said aluminum pre-mold structure, and a cathode connected with a graphite rod.

4. The method according to claim 1, wherein said aluminum pre-mold structure is anodized twice in step (a3).

5. The method according to claim 1, wherein said porous aluminum oxide mold is immersed in said phosphoric acid to obtain evenly distributed pores.

6. A method of making an LED using the mold made by the method of claim 1, wherein said porous aluminum oxide mold has a first imprinting method, comprising steps of:
    (b1) coating a polymer resist on a surface of an object;
    (b2) processing a hot-imprinting on said surface of said object by using said porous aluminum oxide mold;
    (b3) removing said polymer resist by etching after cooling down temperature and thus revealing a surface area of said object; and
    (b4) processing an etching on said surface area of said object to obtain a sub-micron pattern.

7. The method according to claim 6, wherein a p-side up light emitting diode (LED) is fabricated by using said first imprinting method, comprising steps of:
- (e) after imprinting a sub-micron pattern on a first substrate by applying said first imprinting method to said first substrate, growing epitaxy layers of an n-type semiconductor, an active layer and a p-type semiconductor sequentially on said first substrate; and
- (f) imprinting a sub-micron pattern on said p-type semiconductor by applying said first imprinting method to said p-type semiconductor to obtain said p-side up LED.

8. The method according to claim 6, wherein an n-side up LED is fabricated by using said first imprinting method, comprising steps of:
- (g) growing epitaxy layers of an n-type semiconductor, an active layer and a p-type semiconductor on a first substrate sequentially, then imprinting a sub-micron pattern on said p-type semiconductor by applying said first imprinting method to said p-type semiconductor;
- (h) bonding to a second substrate with a bonded layer obtained;
- (i) removing said first substrate to reveal said n-type semiconductor; and
- (j) imprinting a sub-micron pattern on said n-type semiconductor by applying said first imprinting method to said n-type semiconductor to obtain said n-side up LED.

9. A method of making an LED using the mold made by the method of claim 1, wherein said porous aluminum oxide mold has a second imprinting method, comprising steps of:
- (c1) coating a protection layer then a polymer resist on a surface of an object sequentially;
- (c2) processing a hot-imprinting on said surface of said object by using said porous aluminum oxide mold;
- (c3) removing said polymer resist by etching after cooling down temperature and thus revealing said protection layer;
- (c4) etching said protection layer to reveal a surface area of said object; and
- (c5) etching said surface area to obtain a sub-micron pattern.

10. The method according to claim 9, wherein a p-side up LED is fabricated by using said second imprinting method, comprising steps of:
- (e) after imprinting a sub-micron pattern on a first substrate by applying said second imprinting method to said first substrate, growing epitaxy layers of an n-type semiconductor, an active layer and a p-type semiconductor sequentially on said first substrate; and
- (f) imprinting a sub-micron pattern on said p-type semiconductor by applying said second imprinting method to said p-type semiconductor to obtain said p-side up LED.

11. The method according to claim 9, wherein an n-side up LED is fabricated by using said second imprinting method, comprising steps of:
- (g) growing epitaxy layers of an n-type semiconductor, an active layer and a p-type semiconductor on a first substrate sequentially, then imprinting a sub-micron pattern on said p-type semiconductor by applying said second imprinting method to said p-type semiconductor;
- (h) bonding to a second substrate with a bonded layer obtained;
- (i) removing said first substrate to reveal said n-type semiconductor; and
- (j) imprinting a sub-micron pattern on said n-type semiconductor by applying said second imprinting method to said n-type semiconductor to obtain said n-side up LED.

12. A method of making an LED using the mold made by the method of claim 1, wherein said porous aluminum oxide mold has a third imprinting method, comprising steps of:
- (d1) coating a polymer resist on a surface of an object;
- (d2) processing a hot-imprinting on said surface of said object by using said porous aluminum oxide mold;
- (d3) coating a polymer resist over said polymer resist and said surface of said object after cooling down temperature; and
- (d4) lifting off said polymer resist and said protection layer right above said polymer resist to reveal a surface area of said object; and
- (d5) etching said surface area to obtain a sub-micron pattern.

13. The method according to claim 12, wherein a p-side up LED is fabricated by using said third imprinting method, comprising steps of:
- (e) after imprinting a sub-micron pattern on a first substrate by applying said third imprinting method to said first substrate, growing epitaxy layers of an n-type semiconductor, an active layer and a p-type semiconductor sequentially on said first substrate; and
- (f) imprinting a sub-micron pattern on said p-type semiconductor by applying said third imprinting method to said p-type semiconductor to obtain said p-side up LED.

14. The method according to claim 12, wherein an n-side up LED is fabricated by using said third imprinting method, comprising steps of:
- (g) growing epitaxy layers of an n-type semiconductor, an active layer and a p-type semiconductor on a first substrate sequentially, then imprinting a sub-micron pattern on said p-type semiconductor by applying said third imprinting method to said p-type semiconductor;
- (h) bonding to a second substrate with a bonded layer obtained;
- (i) removing said first substrate to reveal said n-type semiconductor; and
- (j) imprinting a sub-micron pattern on said n-type semiconductor by applying said third imprinting method to said n-type semiconductor to obtain said n-side up LED.

* * * * *